United States Patent
Wasaki

[11] Patent Number: 6,069,406
[45] Date of Patent: May 30, 2000

[54] WIRING PATTERNED FILM AND PRODUCTION THEREOF

[75] Inventor: Ayako Wasaki, Nagano, Japan

[73] Assignee: Shinko Electric Industries Co., Ltd., Nagano, Japan

[21] Appl. No.: 09/079,881

[22] Filed: May 15, 1998

[30] Foreign Application Priority Data

| May 20, 1997 | [JP] | Japan | 9-129393 |
| Jun. 23, 1997 | [JP] | Japan | 9-165570 |

[51] Int. Cl.⁷ .............................. H01L 23/48; H01L 23/52
[52] U.S. Cl. ............................................. 257/773; 666/692
[58] Field of Search .................................... 257/773, 666, 257/692; 438/123, 611, 619, 667, 411, FOR 342; 361/813

[56] References Cited

U.S. PATENT DOCUMENTS

| 2,758,797 | 8/1956 | Miklau . | |
| 3,374,537 | 3/1968 | Doelp, Jr. ............................... | 257/666 |
| 3,460,105 | 8/1969 | Birt et al. . | |
| 4,234,666 | 11/1980 | Gursky ..................................... | 257/666 |
| 5,177,863 | 1/1993 | Lam .......................................... | 29/830 |
| 5,309,316 | 5/1994 | Yagi et al. ............................... | 257/666 |
| 5,844,779 | 12/1998 | Choi ........................................ | 257/684 |

FOREIGN PATENT DOCUMENTS

| 4244544 | 7/1993 | Germany ................................. | 257/692 |
| 63-215045 | 9/1988 | Japan ............................ | 438/FOR 342 |
| 5-74999 | 3/1993 | Japan ..................................... | 257/692 |
| WO 94/03036 | 2/1994 | WIPO . | |

*Primary Examiner*—Mahshid Saadat
*Assistant Examiner*—Jhihan B Clark
*Attorney, Agent, or Firm*—Pennie & Edmonds LLP

[57] ABSTRACT

A wiring patterned film wherein a gold lead 18 which extends from a wiring pattern formed on the adhesive side of a resin film adhered to the side of a semiconductor element on which an electrode terminal is formed, and which bridges a window section opening on the resin film, is cut off at a prescribed location facing the window section and bent so that the lead tip is connected to the electrode terminal, wherein a notch section is formed at a prescribed location of the gold lead 18 bridging the window section to facilitate cutting of the gold lead 18, and at least the narrowest part of the notch section 42a is formed into an upward protruding convex curve at the surface opposite the back side facing the window section.

3 Claims, 4 Drawing Sheets

WIRING PATTERNED FILM AND PRODUCTION THEREOF

BACKGROUND OF THE INVENTION

1. Field of the Invention

The present invention relates to a wiring patterned film and its production. Specifically, the invention relates to a wiring patterned film and its production wherein a gold lead which extends from a wiring pattern formed on the adhesive side of a resin film adhered to the side of a semiconductor element on which an electrode terminal is formed, and which bridges a window section opening on the resin film, is cut off at a prescribed location facing the window section and is bent so that the lead tip is connected to the electrode terminal.

2. Description of the Related Art

In recent years, practical applications of chip size packages, such as that shown in FIG. 3, which are small and can be made with small mounting areas, are being attempted as semiconductor devices built into portable electronic devices such as cellular phones (see, for example, WO 94/03036).

This type of chip size package has a wire patterned film 11 (hereunder sometimes referred to simply as "film 11"), consisting of a wiring pattern 14 formed on one side of a resin film 16, on one side of a semiconductor element 10 on which is formed an electrode terminal 20 around the edges, and adhered at a region inward from the region where the electrode terminal 20 is formed, via an elastomer layer 12 which is an elastic resin layer. The film 11 has a smaller area than the side of the semiconductor element 10 on which it is adhered, and a lead made of gold (hereunder referred to as "gold lead") 18 extends from one end of the wiring pattern 14 consisting of a gold layer and copper layer formed on the adhesion side with the elastomer layer 12, to the outer edge of the resin film 16.

This gold lead 18 is bent so that the lead tip is connected to the electrode terminal 20 of the semiconductor element 10 while it is sealed, together with the electrode terminal 20 etc., by a sealing resin 22.

Also, at an opening 23 which reaches the back side surface at the other end of the wiring pattern 14 formed on the resin film 16, there is provided a bump 24, as an external connection terminal, formed by a plated or soldered ball or the like.

The film 11 is manufactured by the process illustrated in FIGS. 4A to 4F. In these illustrations, a copper foil 32 attached to one side of a resin film 16 is coated with an organic polymer resist layer 34 (hereunder sometimes to be referred to simply as "resist layer 34") and subjected to light exposure and development, so as to expose the portion of the copper foil 32 on which the wiring pattern 14 and gold lead 18 are to be formed (FIGS. 4A, 4B). The exposed areas of the copper foil 32 are coated with an electrolytic gold plating to form gold plated sections 36 (FIG. 4C).

Also, after the coated resist layer 34 is removed and window sections 23, 23 are formed, which expose the back side of the copper foil 32 at prescribed locations on the other side of the resin film 16, bumps 24 are formed by electrolytic nickel plating (FIG. 4D). The opposite side of the resin film 16 is covered with a mask at this time.

Next, the sections of the resin film 16 on which the gold leads 18 are to be formed are removed by laser light, to form gold lead-formed sections 38 where the back side of the copper foil 32 is exposed (FIG. 4E).

Then, by using chemical etching or the like on the gold lead-formed sections 38 to remove the copper foil 32 where the back side is to be exposed, it is possible to form wiring patterns 14 and gold leads 18 (FIG. 4F). In this step, the copper foil 32 where the back side is exposed is removed at the gold lead-formed sections 38, forming window sections 40 bridged by the gold leads 18 consisting of only the gold layer.

Thus, for each wiring pattern 14 and gold lead 18 which are formed in connection, the wiring pattern 14 consists of a double layer of a copper layer and gold layer, while the gold lead 18 consists of only the gold layer. The gold lead 18 can therefore be easily bent.

In the step shown in FIG. 4F, the copper foil 32 is also simultaneously removed on the other side of the resin film 16 so that the wiring pattern 14 is not formed there.

To manufacture of a semiconductor device using a wiring patterned film 11 on which such a wiring pattern 14 and gold lead 18 are formed, an elastomer layer 12 is used to connect the side of the resin film 16 on which the wiring pattern 14 is formed to the side of the semiconductor device 10 on which the electrode terminal is formed.

Next, the gold lead 18 bridging the window section 40 is cut at a prescribed location and bent with a bonder (not shown), while the lead tip of the gold lead 18 which has been cut is connected to the electrode terminal 20 of the semiconductor device 10, after which the gold lead 18 and electrode terminal 20 are sealed with a sealing resin 22.

Incidentally, notches 42 are formed at prescribed locations on each of the gold leads 18 as shown in FIG. 5, in order to facilitate cutting of the gold lead 18 when the gold lead 18 bridging the window section 40 is cut.

In this type of conventional wiring patterned film 11, it is necessary to form the notches 42 to a minimum prescribed depth in the widthwise direction of the gold leads 18 in order to ensure satisfactory cutting of the gold leads 18.

However, because deeper notches 42 are more difficult to form and reduce the mechanical strength of the gold leads 18, the notches 42 must by necessity be made shallow. This in turn reduces the cuttability of the gold leads 18.

In addition, when the gold leads 18 are fine as in the case of high-density gold leads 18 required for highly integrated semiconductor elements 10, the depth of the notches 42 must be made even more shallow.

DISCLOSURE OF THE INVENTION

It is an object of the present invention to provide a wiring patterned film and its production process, whereby notches can be easily formed at the prescribed locations of the gold leads bridging the window sections open on the resin film, and whereby the gold leads can be easily cut at the prescribed locations, as well as a gold plating solution which can be used for this process.

With the goal of overcoming the problems described above, the present inventors first made microscopic observations of lead portions A where the notch sections 42 are formed at their narrowest, as shown in FIG. 5, and have found that in a conventional film 11, the surface opposite the flat back side which faces the window section 40 at the lead portion where the notch section 42 is formed at its narrowest has a flat board-like shape, as shown in FIG. 6, and that the lateral cross-sectional shape of the lead portion is rectangular, as shown in FIG. 7. It was also found that at the notch section 42 of the gold leads 18 shown in FIG. 6 and FIG. 7, the notch depth in the widthwise direction of the gold lead 18 of the notch section 42 and its cuttability are in a proportional relationship.

Thus, as a result of much research on shapes at the narrowest parts of notch sections of gold lead portions in order to achieve improved cuttability of the leads, the present inventors completed the invention upon finding that if the lateral cross-sectional shape of a lead portion, at which the notch section is formed at its narrowest, has a semicylindrical shape, its cuttability may be improved compared to a gold lead wherein the lateral cross-sectional shape of the lead portion is rectangular, and also that a gold lead wherein the lead portion at which the notch section is formed at its narrowest has a semicylindrical lateral cross-sectional shape can be easily formed by electrolytic plating by the application of a pulse waveform plating current to a gold plating solution containing substantially no grain refiner.

In other words, the present invention provides a wiring patterned film wherein a gold lead which extends from a wiring pattern formed on the adhesive side of a resin film adhered to the side of a semiconductor element on which an electrode terminal is formed, and which bridges a window section opening on the resin film, is cut off at a prescribed location facing the window section and bent so that the lead tip is connected to the electrode terminal, wherein a notch section is formed at a prescribed location of the gold lead bridging the window section to facilitate cutting of the gold lead, and at least the narrowest part of the notch section is formed into an upward protruding convex curve on the surface opposite the back side facing the window section.

According to this invention, the gold lead is formed by gold plating, and its surface opposite the back side facing the window section may formed into an upward protruding convex curve along the entire length of the gold lead, so that both the cuttability and the flexibility of the gold lead can be exhibited.

Further improved cuttability can be achieved if the gold lead has a semicylindrical lateral cross-sectional shape along its entire length including the notch section.

Incidentally, the phrase "notch section formed at a prescribed location of the lead" as used according to the invention means that a notch section created by cutting away the sides of the lead is formed at a location where the lead tip connected to the electrode terminal is to be formed.

The present invention further provides a process, for producing a wiring patterned film, which comprises forming a resist layer on the surface of a metal layer formed on one side of a resin film, so that the metal layer is exposed in the desired pattern, and then coating the exposed portions of the metal layer with an electrolytic gold plating to form a wiring pattern and removing the resin film portion and metal layer portion from the region of the wiring pattern in which the gold lead is to be formed, cutting and bending so that the lead tip connects with the electrode terminal of the semiconductor element, to thus produce a wiring patterned film with an open window section bridged by the gold lead, during which process a resist layer is used to form a slender section which is narrower than the width of the lead at a prescribed section of the exposed portion of the metal layer on which the lead is to be formed, in order to form a notch section at the prescribed location of the gold lead bridging the window section for easier cutting of the gold lead, after which a pulse waveform plating current is applied in a gold plating solution containing substantially no grain refiner, to form an electrolytic gold plating on the exposed portions of the metal layer.

According to this invention, the gold plating solution used is a gold plating solution containing a gold cyanide compound and having an alkali metal content of no greater than 1.5 mol/liter, so that when an organic polymer resist layer is used as the resist layer, it is possible to prevent peeling of the organic polymer resist layer during the electrolytic gold plating.

The phrase "to form a notch section at a prescribed location of the lead" as used according to the invention means that a notch section created by cutting away the sides of the lead is formed at a location where the lead tip is to be formed in connection with the electrode terminal.

The present invention further provides a gold plating solution which is a gold plating solution containing a gold cyanide compound used for electrolytic gold plating, wherein the conductivity salt added to the gold plating solution is a magnesium salt and the alkali metal content in the gold plating solution is no greater than 1.5 mol/liter.

According to this invention, an object to be plated which has been partially masked by an organic polymer resist layer is immersed in the gold plating solution to form an electrolytic gold plating, and by forming a conductor pattern-forming and/or lead-forming gold layer on the non-masked sections of the object to be plated it is possible to form a lead, etc. by electrolytic gold plating.

Also, if the magnesium salt used is a magnesium salt with a solubility in water of at least 100 g/liter, then the magnesium salt may be used alone as the conductivity salt.

By adding an ammonium salt to the gold plating solution, it is possible to further improve the electric conductivity of the gold plating solution and stabilize the pH value of the gold plating solution.

DESCRIPTION OF THE PREFERRED EMBODIMENTS

Figure 6:
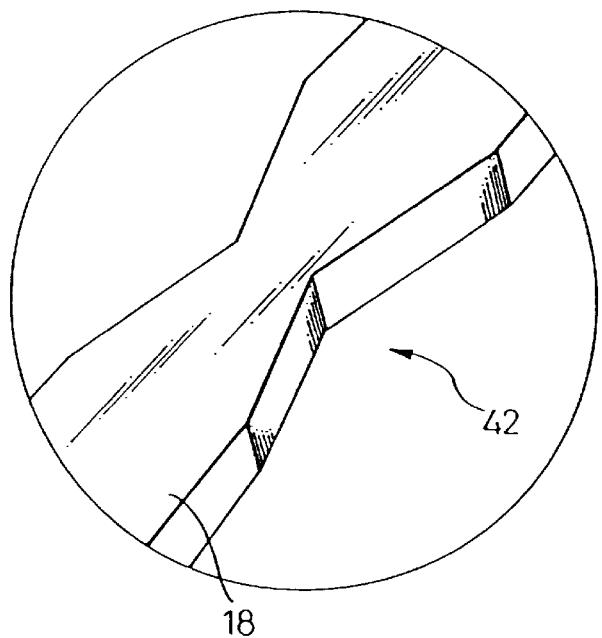
FIG. 6 is an enlarged view showing a lead portion where a notch section is formed at its narrowest on a gold lead bridging the window section of a conventional wiring patterned film.
Figure 7:
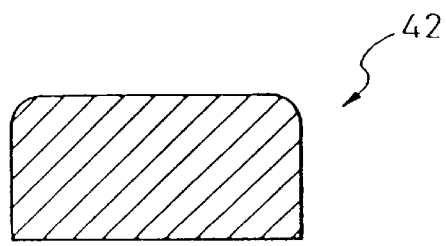
FIG. 7 is a cross-sectional view of the lateral cross-sectional shape of the lead portion of FIG. 6 where the notch section is formed at its narrowest.

According to the wiring patterned film of the invention, the lead portion where the notch section on the gold lead is formed at its narrowest is in the shape of an upward protruding convex curve at the surface opposite the back side facing the window section. As shown in FIG. 6 and FIG. 7, the narrowest part of the notch section formed on this type of lead portion can be made slimmer than the narrowest part of the notch section of a lead portion formed as a flat board, and can therefore improve the cuttability of the gold lead.

The wiring pattern and gold lead of the wiring patterned film can also be formed by electrolytic gold plating, but most gold plating solutions used for electrolytic gold plating contain a grain refiner such as thallium. With gold plating solutions containing such grain refiners, the lead portion becomes flat at the narrowest part of the notch section formed by electrolytic gold plating.

Here, according to the present invention, a pulse waveform plating current is applied in a gold plating solution which contains substantially no grain refiner such as thallium to form an electrolytic gold plating, thereby forming a lead portion with the narrowest part of the notch section formed into the shape of an upward protruding convex curved at the surface opposite the back side facing the window section.

In the wiring patterned film of the invention, the notch section must be formed at a prescribed location on the gold lead bridging the window section opening on the resin film. The notch section is preferably formed at the location where the gold lead is to be cut, that is, near the location where the gold lead tip will contact with the electrode terminal of the semiconductor element. The notch section consists of a notch formed in the sides of the lead.

Figure 1:
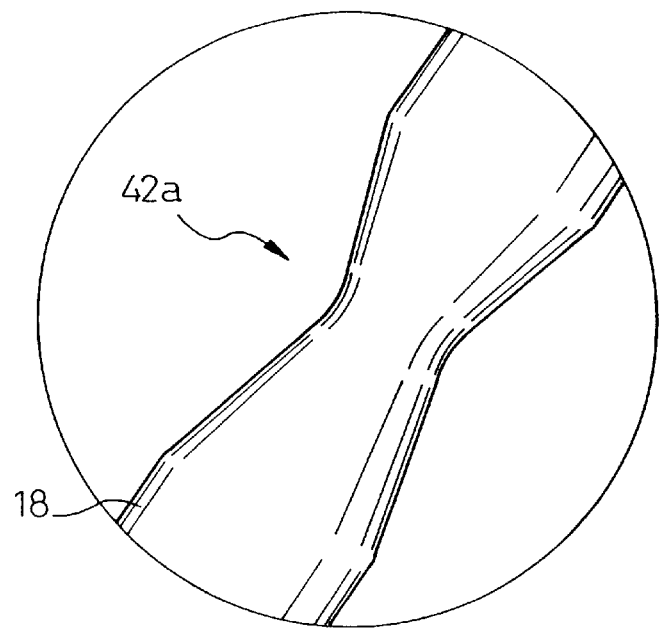
FIG. 1 is an enlarged view of a lead portion wherein a notch section is formed at its narrowest on a gold lead bridging the window section of a wiring patterned film according to the invention.
Figure 3:
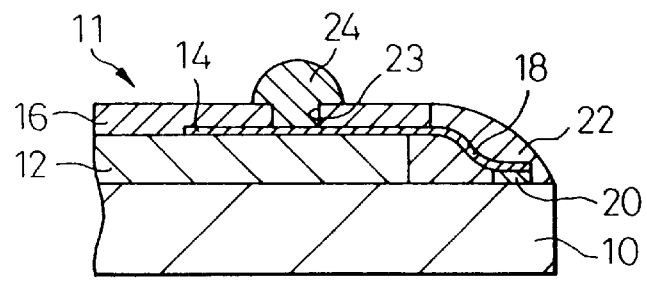
FIG. 3 is a partial cross-sectional view as an overall illustration of a semiconductor device obtained utilizing a wiring patterned film.

Also, the lead portion where the notch section is formed at its narrowest must be formed so that the surface opposite the back side facing the window section is a side with an upward convex curve. When the lead portion where the notch section is formed at its narrowest is observed under a microscope, no clear angles (corners) are found in the lead portion, as shown in FIG. 1. This convex curved side is the surface which contacts with the electrode terminal 20 of the semiconductor element 10 shown in FIG. 3.

Figure 2A:
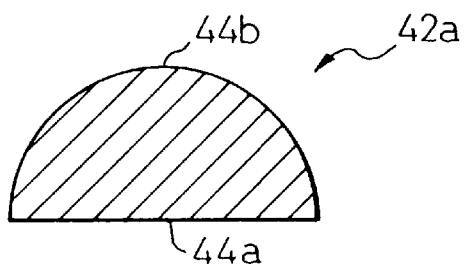
FIGS. 2A and 2B are cross-sectional views of the lateral cross-sectional shape of the lead portion of FIG. 1 where the notch section is formed at its narrowest.
Figure 2B:
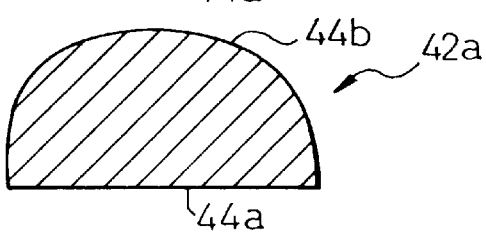

The lead portion where the notch section 42a is formed at its narrowest is a flat surface at the back side facing the window section, and the lateral cross-sectional shape of the lead portion therefore becomes semicylindrical, as shown in FIG. 2A and FIG. 2B. The semicylindrical shape may be a half-moon with a high center on the side 44b forming the convex curve opposite the side 44a forming the flat back side facing the window section, as in FIG. 2A, or the curvature near the center of the side 44b forming the convex curved side opposite the side 44a forming the flat back side facing the window section may be smaller than the curvature at the edges of the side 44b, as shown in FIG. 2B.

As FIGS. 1, 2A and 2B show, the gold lead 18 having a semicylindrical lateral cross-sectional shape at the lead portion where the notch section 42a is formed at its narrowest, can be made slimmer at the narrowest section than a gold lead with a rectangular lateral cross-sectional shape of the lead portion where the notch section 42 is formed at its narrowest, as shown in FIGS. 6 and 7. As a result, it is possible to improve the cuttability of the gold lead 18 in which the notch section 42a is formed, compared to a gold lead with a notch section 42 formed as shown in FIGS. 6 and 7.

Incidentally, the gold lead 18 may be formed so as to have a semicylindrical lateral cross-sectional shape across its entire length.

A wiring patterned film provided with a gold lead 18 on which a notch section 42a is formed as shown in FIGS. 1, 2A and 2B is manufactured by the manufacturing process shown in FIGS. 4A to 4F. Specifically, after forming a resist layer 34 on a copper foil 32 serving as the metal layer attached to one side of a resin film 16 so that the copper foil 32 is exposed in a desired pattern, the exposed sections of the copper foil 32 are coated with an electrolytic gold plating to form a wiring pattern 14 and a gold lead 18 extending from one end of the wiring pattern 14 and connected at one end with the electrode terminal of the semiconductor device, thus forming a gold plated section.

The resist layer 34 is then removed, and after forming openings 23, 23 from the other side of the resin film 16 so that the back side of the copper foil 32 is exposed through the portions of the resin film 16 corresponding to the other side of the wiring pattern 14, a bump 24 is formed in each opening 23. The bump 24 may be, for example, a nickel bump, formed by electrolytic nickel plating using the copper foil 34 as the electrode.

Next, the portion of the resin film 16 on which the gold lead 18 is formed is removed by laser irradiation, to form a gold lead-forming area 38 where the back side of the copper foil 32 is exposed.

Then, the copper foil 32 exposed at the back side through the gold lead-forming area 38 may be removed by chemical etching or the like, to form the wiring pattern 14 and gold lead 18. In this step, the copper foil 32 whose back side is exposed in the gold lead-forming area 38 is removed so that a window section 40 is formed which is bridged by the gold lead 18.

The exposed copper foil 32 on which no wiring pattern 14 is formed on the one side of the resin film 16 is also simultaneously removed during removal of the copper foil 32 exposed on the back side in the gold lead-forming area 38 by chemical etching, etc.

When forming the resist layer 34 on the copper foil 32 in the manufacturing process for the wiring patterned film shown in FIGS. 4A to 4F, the resist layer 34 is also used to form a slender portion which is narrower than the width of the gold lead at the exposed portion of the copper foil 32 where the gold lead is to be formed, in order to form the notch section 42a at the prescribed location of the gold lead 18 bridging the window section 40 for easier cutting of the gold lead 18.

Also, when forming the electrolytic gold plating on the exposed portion of the copper foil 32, it is important to use a gold plating solution which contains substantially no grain refiner such as thallium, and to utilize pulse plating with a pulse waveform plating power source.

Gold plating solutions normally used for electrolytic gold plating contain grain refiners such as thallium, lead or arsenic. When a gold plating solution containing a grain refiner is used, the lead portion where the notch section 42 is formed at its narrowest has a board-like shape, which reduces the cuttability of the gold lead.

Also, when direct current plating with a direct current power source is employed instead of pulse plating, the lead portion where the notch section 42 is formed at its narrowest has a board-like shape as well.

According to the invention, the gold plating conditions used are electrolytic gold plating conditions preferably with a current density of 1–2.5 A/dm$^2$, and pulse conditions with an ON-Time of 0.1–3.0 msec and an OFF-Time of at least 1 msec.

When manufacturing a semiconductor device using a wiring patterned film with the wiring pattern 14 and gold lead 18 formed in this manner, the side of the resin film 16 on which the wiring pattern 14 is to be formed is adhered with an elastomer layer 12 to the side of the semiconductor element 10 on which the electrode terminal is to be formed.

Next, a bonder is used to cut the gold lead 18 bridging the window section 40 at the narrowest part of the notch section 42a, and connect the lead tip to the electrode terminal 20 of the semiconductor device 10 while bending the cut gold lead 18. The cuttability of the gold lead 18 by the bonder is better than with a gold lead wherein the lead portion where the narrowest part of the notch section 42 has a board-like shape, as shown in FIG. 6 and FIG. 7.

Then, sealing of the gold lead 18 and electrode terminal 20 with a sealing resin 22 can complete the semiconductor device (chip size package).

Figure 4A:
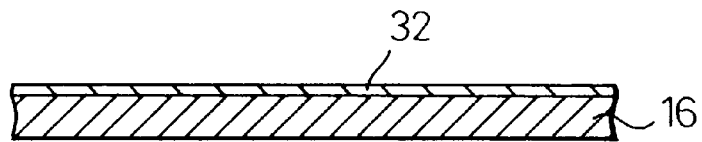
FIGS. 4A, 4B, 4C, 4D, 4E and 4F are step-by-step illustrations of a production process for a wiring patterned film.
Figure 4B:
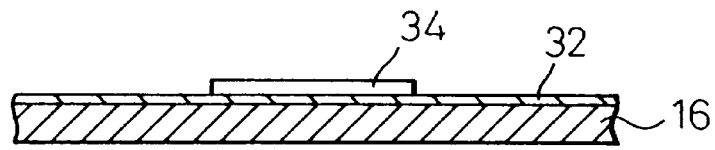
Figure 4C:
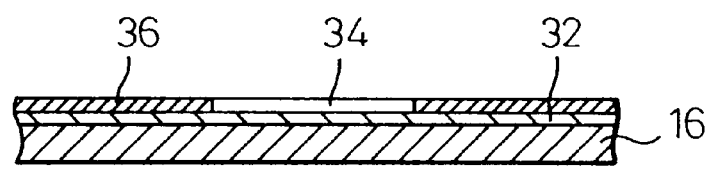
Figure 4D:
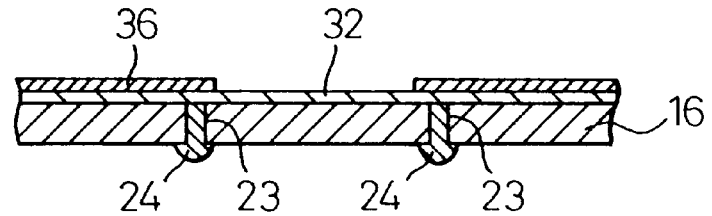
Figure 4E:
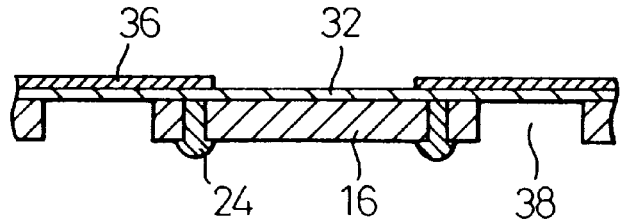
Figure 4F:
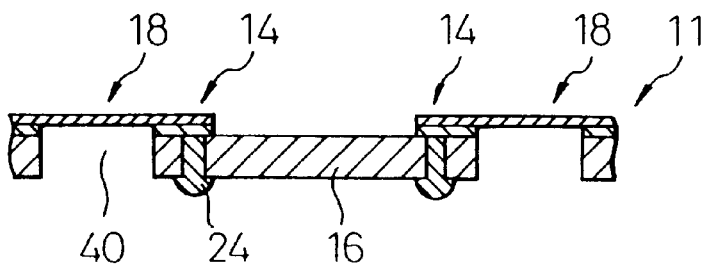

Incidentally, industrial electrolytic gold plating employs cyanide-based gold plating solutions containing gold cyanide compounds which are satisfactorily stable in plating solutions and have a long solution life, and in the electrolytic gold plating for formation of the gold lead 18, etc. shown in FIGS. 4A to 4B, it is preferred to form a thick plating with the gold layer at a thickness of at least 20 $\mu$m. When such a thick plating is formed using a cyanide-based gold plating solution under conditions of, for example, a current density of 1 A/dm$^2$, the resin film 16 with the copper foil 32 partially masked by the resist layer 34 must be immersed in the gold plating solution for about 40 minutes at 60–70° C.

However, under these electrolytic gold plating conditions, the resist layer 34 tends to peel, resulting in lower precision of the gold lead 18, etc.

Although this phenomenon of peeling of the resist layer 34 can be prevented by using a non-cyanide-based gold plating solution employing gold sulfite or the like, non-cyanide-based gold plating solutions have lower stability and a shorter solution life than cyanide-based gold plating solutions, and are therefore industrially impractical.

This phenomenon of peeling of the resist layer 34 results in a greater influence of the alkali metal salt, such as a potassium or sodium salt, added to the cyanide-based plating solution as a conductivity salt.

Therefore, by using an ammonium salt such as monoammonium phosphate or diammonium citrate instead of an alkali metal salt as the conductivity salt, it is possible to prevent the phenomenon of peeling of the resist layer 34 during the electrolytic gold plating.

However, the alkali metal is introduced from potassium gold cyanide [KAu(CN)$_2$] or the like added as the gold source, and when the amount of the potassium gold cyanide [KAu(CN)$_2$] in the gold plating solution falls below a prescribed amount, potassium gold cyanide [KAu(CN)$_2$] is supplied for continuous use. The alkali metal thus gradually accumulates in the gold plating solution.

Nevertheless, by controlling the alkali metal content of the gold plating solution to be no greater than 1.5 mol/liter, and preferably no greater than 0.3 mol/liter, it is possible to control the phenomenon of peeling of the resist layer 34 during the electrolytic gold plating.

Also, when the electrical conductivity of the gold plating solution is inadequate with an ammonium salt, an alkali earth metal salt may be used as the conductivity salt. The phenomenon of peeling of the resist layer 34 during the electrolytic gold plating can still be prevented even with addition of an alkali earth metal salt. Preferred as alkali earth metal salts are magnesium and calcium salts, and especially magnesium salts. As magnesium salts there may be mentioned magnesium sulfate, magnesium chloride and magnesium acetate. An alkali earth metal salt and an ammonium salt may also be used in combination as conductivity salts.

Thus, the invention also provides a gold plating solution containing a gold cyanide compound used for electrolytic gold plating, where the gold plating solution is characterized in that the conductivity salt added to the gold plating solution is a magnesium salt and the alkali metal content of the gold plating solution is no greater than 1.5 mol/liter.

In this gold plating solution, the alkali metal salt which has been added in large amounts as the conductivity salt in conventional cyanide-based gold plating solutions is replaced with a magnesium salt as an alkali earth metal salt, and the alkali metal content is adjusted to be no greater than 1.5 mol/liter.

Thus, by adjusting the alkali metal content to be as low as possible, it is possible to prevent the phenomenon of peeling of the organic polymer resist layer (hereunder referred to simply as a "resist layer") which inevitably occurs during thick plating when forming leads, etc. by electrolytic gold plating with conventional cyanide-based gold plating solutions.

As a result, by immersing an object to be plated which has been partially masked with a resist layer into the cyanide-based gold plating solution containing the gold cyanide compound for electrolytic gold plating of the non-masked portions, it is possible to form a gold layer, which allows formation of the lead, etc.

Incidentally, although the mechanism of peeling of the resist layer is not fully understood, it is believed that the Na$^+$, K$^+$ or other alkali metal ions penetrate the resist layer by the mechanism of electro-osmosis, pushing the coated resist layer upward and promoting its peeling. On the other hand, Mg$^+$ hydrate molecules, being larger than alkali metal ions, do not penetrate the resist layer so easily and therefore do not readily promote peeling of the resist layer.

The gold plating solution of the invention is a cyanide-based gold plating solution containing a gold cyanide compound. Potassium gold cyanide [KAu(CN)$_2$] is used as the gold source in the cyanide-based gold plating solution.

An alkali earth metal is used as the conductivity salt in the cyanide-based gold plating solution. Preferred alkali earth metals are magnesium salts and calcium salts, with magnesium salts being particularly suitable from the standpoint of solubility. Magnesium salts with a solubility of at least 100 g/liter in water are most preferred. Such magnesium salts include magnesium sulfate, magnesium chloride, magnesium acetate and magnesium nitrate.

The preferred amount of the conductivity salt to be used is 50–400 g/liter, and especially 80–250 g/liter. If the conductivity salt is present at less than 50 g/liter, the conductivity of the gold plating solution will tend to be inadequate, thus hampering uniform electrodeposition, while if it is present at greater than 400 g/liter the effect of improved conductivity of the gold plating solution will be practically saturated, thus tending to lower its practical usability.

When a common alkali metal salt is used as the conductivity salt in a conventional cyanide-based gold plating solution, a phenomenon of peeling of the resist layer tends to occur during immersion of an object to be plated which has been partially masked with a resist layer in order to form a thick plating by electrolytic plating onto the non-masked portions.

Magnesium salts have slightly lower solubility in water than alkali metal salts such as KCN. Consequently, in cases where the electrical conductivity of the gold plating solution is inadequate when a magnesium salt is used as the conductivity salt, an ammonium salt can be used to further improve the electrical conductivity of the gold plating solution. This combined use of an ammonium salt can stabilize the pH value of the gold plating solution. As ammonium salts there may be used ammonium phosphate, ammonium citrate and the like.

Incidentally, an alkali metal is introduced into the cyanide-based gold plating solution from the potassium gold cyanide [KAu(CN)$_2$], etc. used as the gold source. Also, when the amount of the potassium gold cyanide [KAu(CN)$_2$] in the gold plating solution falls below a prescribed amount, potassium gold cyanide [KAu(CN)$_2$] is supplied to the cyanide-based gold plating solution for continuous use. The alkali metal thus gradually accumulates in the gold plating solution.

Nevertheless, by controlling the alkali metal content of the gold plating solution to be no greater than 1.5 mol/liter, and preferably no greater than 0.3 mol/liter, it is possible to control the phenomenon of peeling of the resist layer.

Furthermore, when the conductivity salt used is a calcium salt which has lower solubility in water than magnesium salts, a small amount of an alkali metal salt may be added to achieve a sufficient level of conductivity for the gold plating solution.

The cyanide-based gold plating solution according to the invention can be suitably used to manufacture semiconductor devices with thick platings, by immersion of an object to be plated which has been partially masked with a resist layer, for electrolytic gold plating of the non-masked portions.

The resist used to form the resist layer may be an acrylic resin-based resist used for electrodeposition resists or dry film resists, or an epoxy resin-based resist used for solder resists.

The gold plating conditions employed for manufacture of such a semiconductor device may be any desired set of conditions, but a plating solution temperature of 60–70° C. and a current density of 0.1–2.5 A/dm$^2$ are preferred.

The cyanide-based gold plating solution of the invention may also be used for decorative gold plating in addition to manufacture of semiconductor devices.

The present invention will now be further explained by way of examples.

EXAMPLE 1

A wiring patterned film 11 was manufactured by the production process illustrated in FIGS. 4A to 4F. First, a resist layer 34 was formed on a copper foil 32 adhered to one side of a resin film 16 so that the copper foil 32 was exposed in the desired pattern. Here, slender areas narrower than the desired gold lead width were formed by the resist layer 34 at prescribed locations of the exposed portions of the copper foil 32 on which the gold leads 18 were to be formed.

Then, an electrolytic gold plating was formed in the gold plating solution and under the pulse conditions listed below, on the exposed portions of the copper foil 32, to form a gold plated section 36 with a thickness of 30 μm, which formed wiring patterns 14 and gold leads 18 each extending from one end of the wiring pattern 14 and connected at one end to an electrode terminal of the semiconductor element.

| Composition of gold plating solution | |
|---|---|
| Monoammonium phosphate | 50 g/liter |
| Diammonium citrate | 100 g/liter |
| Potassium gold cyanide | 12 g/liter |
| Ammonia water | 40 milliliters/liter |
| Pulse conditions | |
| Current density | 1 A/dm$^2$ |
| ON-Time | 0.5 msec |
| OFF-Time | 5.5 msec |

In the above list, the monoammonium phosphate and diammonium citrate are used as conductivity salts, and the ammonia water is used for pH adjustment.

The resist layer 34 was then removed, and after covering one side of the resin film 16 with a mask while openings 23, 23 were formed in the other side of the resin film at locations of the resin film 16 on the opposite side from the wiring pattern 14 so that the back side of the copper foil 32 was exposed, an electrolytic nickel plating was formed using the copper foil 34 as the electrode, to form a bump 24 made of nickel in each opening 23. The surface of the bump was coated with a gold plating.

The sections of the resin film 16 on which the gold leads 18 were to be formed were then removed by laser irradiation to form gold lead-forming sections 38 where the back side of the copper foil 32 was exposed, after which the copper foil 32 was removed by chemical etching at its exposed back side in the gold lead-forming sections 38, to form the wiring patterns 14 and gold leads 18. During the chemical etching, the exposed copper foil on which no wiring pattern 14 was formed was simultaneously removed from the first side of the resin film 16.

Figure 5:
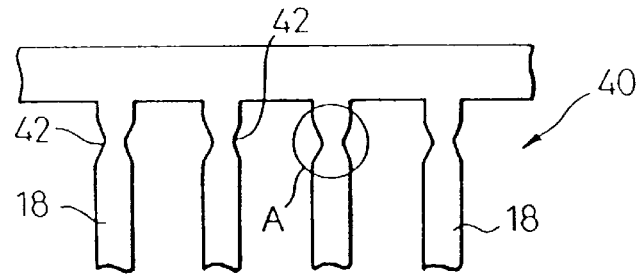
FIG. 5 is a partial enlarged front view showing the condition of a lead portion where a notch section is formed at its narrowest on a gold lead bridging the window section of a wiring patterned film.

The window sections 40 of the resulting wiring patterned film 11 were bridged with the gold leads 18, and a notch section 42$a$ was formed in each gold lead 18, by formation of a notch in the widthwise direction of the gold lead 18, as shown in FIG. 5.

Figure 8:
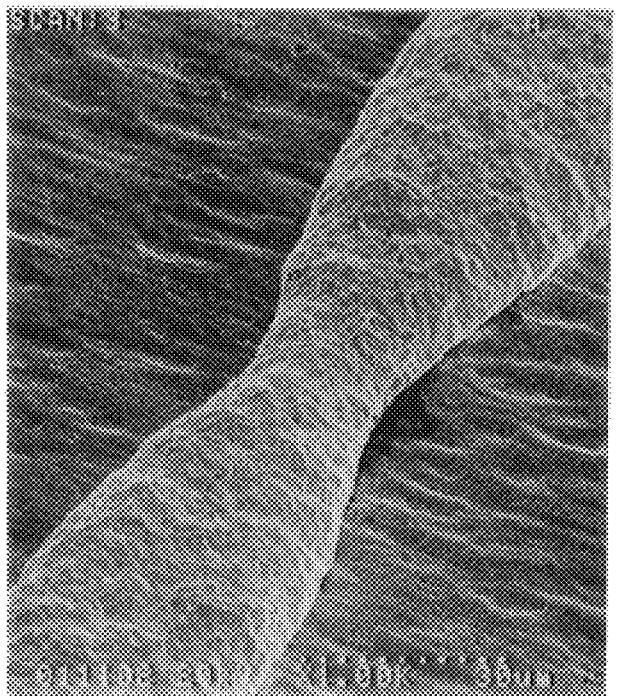
FIG. 8 is a microscope photograph of the notch section of the gold lead obtained in Example 1.

Microscope observation of the notch section 42$a$ showed no clear angles (corners) in the lead portion at the narrowest part of the notch section 42$a$, as shown in FIG. 1, and the lateral cross-sectional shape was semicylindrical across the entire length of the gold lead including the notch section 42$a$. FIG. 8 shows the microscope photograph obtained.

Comparative Example 1

A wiring patterned film 11 was manufactured in the same manner as Example 1, except that thallium sulfate was added, to the gold plating solution of Example 1, to 10 ppm of thallium.

Figure 9:
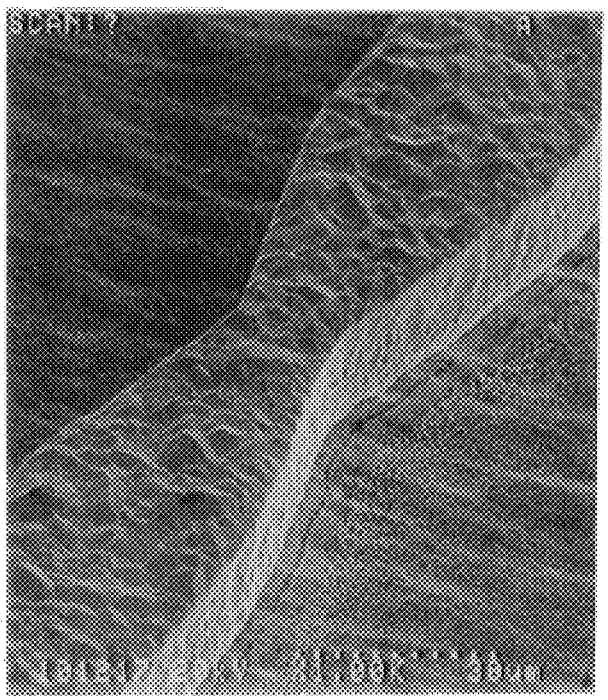
FIG. 9 is a microscope photograph of the notch section of a gold lead obtained in the comparative example.

Upon microscope observation of the notch sections 42$a$ formed in the gold leads 18 bridging the window sections 40 of the formed wiring patterned film 11, it was found, as shown in FIG. 6, that the lead portion where the notch section was formed at its narrowest had a flat board-like shape even on the surface opposite the flat back side facing the window section 40, with clear angles (corners). FIG. 9 shows the microscope photograph obtained.

Furthermore, the lateral cross-sectional shape was rectangular across the entire length of the gold lead including the notch section.

Comparative Example 2

A wiring patterned film 11 was manufactured in the same manner as Example 1, except that direct current plating at a current density of 1 A/dm² was employed instead of the pulse plating in Example 1.

Upon microscope observation of the notch sections 42*a* formed in the gold leads 18 bridging the window sections 40 of the resulting wiring patterned film 11, it was found, as shown in FIG. 6, that the lead portion where the notch section was formed at its narrowest had a roughly flat board-like shape even on the surface opposite the flat back side facing the window section 40, with almost clear angles (corners).

Furthermore, the lateral cross-sectional shape was rectangular across the entire length of the gold lead including the notch section.

EXAMPLE 2

Semiconductor devices (chip size packages) were manufactured using the wiring patterned films 11 obtained in Example 1, Comparative Example 1 and Comparative Example 2. After using an elastomer layer 12 to adhere the side of the resin film 16 on which the wiring pattern 14 was formed to the side of the semiconductor element 10 on which the electrode terminal was formed, a bonder was used to cut the gold lead 18 bridging the window section 40 at the narrowest part of the notch section, and connect the lead tip to the electrode terminal 20 of the semiconductor device 10 while bending the cut gold lead 18, after which the gold lead 18 and electrode terminal 20 were sealed with a sealing resin 22.

The wiring patterned films obtained in Example 1, Comparative Example 1 and Comparative Example 2 were compared in terms of the cuttability of the gold lead 18 by the bonder. The results are shown below.

(high) Example 1>Comparative Example 2>Comparative Example 1 (low)

EXAMPLES 3–5

Exactly the same results were obtained when the same procedure was carried out as in Example 1 using, however, gold plating solutions with the compositions listed below.

| Composition of gold plating solution for Example 3 | |
| --- | --- |
| Monoammonium phosphate | 50 g/liter |
| Diammonium citrate | 100 g/liter |
| Ammonium gold cyanide | 8 g/liter (of gold) |
| Ammonia water | adjustment to pH 6 |
| Composition of gold plating solution for Example 4 | |
| Monoammonium phosphate | 50 g/liter |
| Diammonium citrate | 100 g/liter |
| Potassium gold cyanide | 12 g/liter |
| EDTA | 0.5 g/liter |
| Ammonia water | adjustment to pH 6 |
| Composition of gold plating solution for Example 5 | |
| Monoammonium phosphate | 50 g/liter |
| Diammonium citrate | 100 g/liter |
| Ammonium gold cyanide | 12 g/liter |
| EDTA | 0.5 g/liter |
| Ammonia water | adjustment to pH 6 |

EDTA stands for ethylenediamine-N,N,N',N'-tetraacetic acid, which was used as a chelating agent. Equivalent results can be obtained using the following chelating agents instead of EDTA.

NTPO: nitrilotris(methylenephosphonic acid) trisodium salt

CyDTA: trans-1,2-cyclohexanediamine-N,N,N',N'-tetraacetic acid monohydrate

IDA: iminodiacetic acid

DPTA-OH: 1,3-diaminopropane-2-hydroxy-N,N,N',N'-tetraacetic acid

TTHA: triethylenetetramine-N,N,N',N'',N''',N'''-hexaacetic acid

Methyl-EDTA: 1,2-diaminopropane-N,N,N',N'-tetraacetic acid

EXAMPLE 6

A gold plating solution with the composition listed below was used for gold plating of the resin film 16 shown in FIG. 4B to a gold layer thickness of 20 μm. A resist layer 34 was coated to a thickness of 30 μm on a copper foil 32 adhered to one side of the resin film 16 as shown in FIG. 4B, so that the copper foil 32 was exposed at the sections where the conductor patterns 14 and leads 18 were to be formed.

The gold plating was carried out using a pulse current with the resin film 16 immersed in a gold plating solution, and the gold plating condition was a current density of 0.8–2.5 A/dm². The current efficiency was about 92% at 0.8 A/dm².

| Diammonium phosphate | 45 g/liter |
| --- | --- |
| Citric acid | 100 g/liter |
| Magnesium sulfate | 50 g/liter |
| Potassium gold cyanide | 12 g/liter |
| Ammonia water | adjustment to pH 6 |

The resin film 16 drawn out from the gold plating solution after completion of the gold plating had a bright, soft gold plating section 36 formed on the non-masked areas thereof, with no peeling of the resist layer 34.

EXAMPLE 7

A gold plating solution with the composition listed below was used for gold plating of the resin film 16 shown in FIG. 4B to a gold layer thickness of 20 μm. A resist layer 34 was coated to a thickness of 30 μm on a copper foil 32 adhered to one side of the resin film 16 as shown in FIG. 4B, so that the copper foil 32 was exposed at the sections where the conductor patterns 14 and leads 18 were to be formed.

The gold plating was carried out using a pulse current with the resin film 16 immersed in a gold plating solution, and the gold plating condition was a current density of 0.8–2.5 A/dm². The current efficiency was about 92% at 0.8 A/dm².

| Magnesium chloride | 50 g/liter |
| --- | --- |
| Diammonium citrate | 80 g/liter |
| Potassium gold cyanide | 12 g/liter |
| Ammonia water | adjustment to pH 6 |

The resin film 16 drawn out from the gold plating solution after completion of the gold plating had a bright, soft gold plating section 36 formed on the non-masked areas thereof, with no peeling of the resist layer 34.

EXAMPLE 8

Gold plating was carried out in the same manner as Example 6, except that KCN was added to the gold plating solution of Example 6 to 0.5–1.5 mol/liter of potassium.

The resin film 16 drawn out from the gold plating solution after completion of the gold plating had a bright, soft gold plating section 36 formed on the non-masked areas thereof, with no peeling of the resist layer 34.

Comparative Example 3

Gold plating was carried out in the same manner as Example 6, except that KCN was added to the gold plating solution of Example 6 to 2.0 mol/liter of potassium.

The resin film 16 drawn out from the gold plating solution after completion of the gold plating had peeled portions in the resist layer.

Comparative Example 4

Gold plating was carried out in the same manner as Example 6, except that 120 g/liter of KCN was added instead of the magnesium sulfate in Example 6.

The resin film 16 drawn out from the gold plating solution after completion of the gold plating had peeled portions in the resist layer.

EXAMPLES 9–11

Exactly the same results were obtained when the same procedure was carried out as in Example 6 using, however, gold plating solutions with the compositions listed below.

| Composition of gold plating solution for Example 9 | |
| --- | --- |
| Diammonium phosphate | 45 g/liter |
| Citric acid | 100 g/liter |
| Magnesium sulfate | 50 g/liter |
| Ammonium gold cyanide | 8 g/liter (of gold) |
| Ammonia water | adjustment to pH 6 |
| Composition of gold plating solution for Example 10 | |
| Diammonium phosphate | 45 g/liter |
| Citric acid | 100 g/liter |
| Magnesium sulfate | 50 g/liter |
| Potassium gold cyanide | 12 g/liter |
| EDTA | 0.5 g/liter |
| Ammonia water | adjustment to pH 6 |
| Composition of gold plating solution for Example 11 | |
| Diammonium phosphate | 45 g/liter |
| Citric acid | 100 g/liter |
| Magnesium sulfate | 50 g/liter |
| Ammonium gold cyanide | 8 g/liter (of gold) |
| EDTA | 0.5 g/liter |
| Ammonia water | adjustment to pH 6 |

Equivalent results can be obtained using NTPO, CyDTA, IDA, DPTA-OH, TTHA or Methyl-EDTA instead of EDTA in the above lists.

EXAMPLES 12–14

Exactly the same results were obtained when the same procedure was carried out as in Example 7 using, however, gold plating solutions with the compositions listed below.

| Composition of gold plating solution for Example 12 | |
| --- | --- |
| Diammonium citrate | 80 g/liter |
| Magnesium sulfate | 50 g/liter |
| Ammonium gold cyanide | 8 g/liter (of gold) |
| Ammonia water | adjustment to pH 6 |
| Composition of gold plating solution for Example 13 | |
| Diammonium citrate | 80 g/liter |
| Magnesium sulfate | 50 g/liter |
| Potassium gold cyanide | 12 g/liter |
| EDTA | 0.5 g/liter |
| Ammonia water | adjustment to pH 6 |
| Composition of gold plating solution for Example 14 | |
| Diammonium citrate | 80 g/liter |
| Magnesium sulfate | 50 g/liter |
| Ammonium gold cyanide | 8 g/liter (of gold) |
| EDTA | 0.5 g/liter |
| Ammonia water | adjustment to pH 6 |

Equivalent results can be obtained using NTPO, CyDTA, IDA, DPTA-OH, TTHA or Methyl-EDTA instead of EDTA in the above lists.

According to the present invention, improved cuttability can be achieved at the notch sections of gold leads bridging the windows sections of wiring patterned films, and therefore the depth of the notch sections can be shallower, thus facilitating formation of the notch sections.

Also, since such wiring patterned films have satisfactory cuttability of gold leads with shallower depths at the notch sections, they are easily adaptable for situations in which finer gold leads are required, as occurs with higher densification in the formation of gold leads.

Moreover, according to the invention, it is possible to form thick platings without peeling of the resist layers, even when electrolytic gold plating is performed by immersing an object to be plated which is partially masked with a resist layer, in a cyanide-based gold plating solution containing a gold cyanide compound.

Consequently, the gold plating method using a gold plating solution of the invention facilitates formation of leads, etc. for semiconductor devices by gold plating.

I claim:

1. A wiring patterned film wherein a gold lead which extends from a wiring pattern formed on the adhesive side of a resin film adhered to the side of a semiconductor element on which an electrode terminal is formed, and which bridges a window section opening on said resin film, is cut off at a prescribed location facing said window section and bent so that the lead tip is connected to said electrode terminal, wherein a notch section is formed at a prescribed location of the gold lead bridging said window section to facilitate cutting of said gold lead, and at least the narrowest part of said notch section formed on the lead portion is formed into an upward protruding convex curve at the surface opposite the back side facing the window section.

2. A wiring patterned film according to claim 1, wherein the gold lead is a gold lead formed by gold plating, and said gold lead is formed, along its entire length, into an upward protruding convex curve at the surface opposite the back side facing the window section.

3. A wiring patterned film according to claim 1, wherein the gold lead has a semicylindrical lateral cross-sectional shape along its entire length including the notch section.

* * * * *